United States Patent [19]

Schneider

[11] 3,936,301
[45] Feb. 3, 1976

[54] PROCESS FOR CONTACT PHOTOLITHOGRAPHY UTILIZING A PHOTOMASK HAVING INDENTED CHANNELS

[75] Inventor: Martin Victor Schneider, Holmdel, N.J.

[73] Assignee: Bell Telephone Laboratories, Incorporated, Murray Hill, N.J.

[22] Filed: Apr. 1, 1974

[21] Appl. No.: 456,555

[52] U.S. Cl. .................... 96/36; 96/35.1; 96/36.2; 96/38.3; 96/44
[51] Int. Cl.² .................... G03C 5/00; G03C 5/06
[58] Field of Search .............. 96/35, 35.1, 36, 38.3, 96/36.2, 27 R, DIG. 27, 44, 45; 354/354; 355/78, 133

[56] References Cited
UNITED STATES PATENTS

| | | | |
|---|---|---|---|
| 2,174,882 | 10/1939 | Huebner | 96/DIG. 27 |
| 2,399,975 | 5/1946 | Ball | 96/DIG. 27 |
| 2,793,442 | 5/1957 | Ozga | 96/DIG. 27 |
| 3,744,904 | 7/1973 | Loprest et al | 96/36.2 |

Primary Examiner—Edward C. Kimlin
Attorney, Agent, or Firm—David L. Hurewitz; Wilford L. Wisner

[57] ABSTRACT

In contact type photolithographic masking processes for fabricating planar structures, a photoresist is applied to a wafer and a mask is placed over the photoresist. Illumination through the mask, which has a pattern of opaque areas, produces a photochemical reaction in the photoresist which upon developing creates a duplicate of the mask pattern. However, the photoresist is conventionally applied by a spinning process and the rotation produces a build-up of the photoresist around the edges of the wafer. This build-up prevents the pattern portion of the mask from making good physical contact with the photoresist with a resultant decrease in reproducibility and accuracy of the fabricated pattern. A modified mask is formed with a channel corresponding to the peripheral build-up. The channel accepts the build-up so that good contact may be maintained between the photoresist and the patterned portion of the mask.

5 Claims, 5 Drawing Figures

PROCESS FOR CONTACT PHOTOLITHOGRAPHY UTILIZING A PHOTOMASK HAVING INDENTED CHANNELS

BACKGROUND OF THE INVENTION

This invention relates to photolithographic fabrication of planar structures and, more particularly, to contact printing techniques using liquid photoresists.

Planar structures for microsized circuitry and small semiconductor devices are often fabricated by photolithographic masking techniques. As applications for high frequency circuits increase, greater precision of these miniature circuits and devices is required, and accordingly, the photolithographic techniques must provide increased accuracy and reproducibility.

The basic form of photolithographic masking utilizes a process called contact printing. In this process, a layer of light-sensitive material is applied to a wafer, and a mask, having opaque and transparent portions arranged in a preformed pattern thereon, is placed in contact with the applied layer. Light is then passed through the preformed mask so that an image of the desired pattern is formed on the light-sensitive material. The solubility of this material, termed a photoresist, changes when exposed to optical frequency radiation, especially in the ultraviolet range; negative photoresists become less soluble by illumination and positive photoresists become more soluble when illuminated. However, with illumination through an appropriate mask pattern, either type of photoresist can be used to form and then, with its corresponding solvent, to develop a desired pattern in the photoresist. Selective etching of the underlying wafer material follows in accordance with the developed photoresist pattern. Then the remaining photoresist is removed, leaving a duplicate of the mask pattern in the wafer.

It is essential for high-quality photolithographic reproduction by contact printing for the mask to be maintained in good physical contact with the photoresist during the illumination. If it is not, the light image on the photoresist will be blurred and will not replicate the pattern formed in the mask. Any bumps or irregularities in the bearing surface of the mask, or in the surface of the photoresist, will preclude the requisite contact. Conventionally, the photoresist material is applied in liquid form to a rotating wafer. The spinning technique is used to insure a flat surface of the photoresist. However, centrifugal forces inherently produce a build-up of the photoresist material at the periphery of the wafer and this ridge obviously prevents the mask from being placed in intimate contact with the photoresist.

In addition, other irregularities in the photoresist surface, or the bearing surface, result in loss of physical contact and degraded reproduction.

SUMMARY OF THE INVENTION

In accordance with the present invention, contact between the patterned portion of the mask and the photoresist is insured in spite of the peripheral build-up by modifying the mask to include grooves in the bearing surface of the mask. These grooves form a channel which accepts the excessive photoresist build-up and allows the operative portion of the mask to bear uniformly on the flat interior portion of the photoresist layer.

It is anticipated that the mask pattern would be of the metal-oxide or metal type, formed by materials such as iron oxide or chromium, so that a mechanical process, such as milling, grinding or laser machining, would be suitable for forming the grooves. The mask surface of these masks will not be affected by the debris from such a mechanical process as it would if the pattern were formed by emulsion-coating.

In order to cope with surface roughness the bearing surface of the mask may be made flexible. In addition, problems associated with imperfect linear flatness can be overcome if the opaque portions of the mask are placed on mounds or mesas.

The invention is directed to both the grooved mask structure and the contact printing process using the mask.

DETAILED DESCRIPTION

Contact printing photolithography may be used to create a wide variety of planar structures. The mask pattern and choice of materials will, of course, depend upon the end product being fabricated. A semiconductor array is used herein as an illustrative example, but the invention is directed to the contact printing process and the associated mask; it is not in any way limited to the specific pattern or structure being produced.

Figure 1:
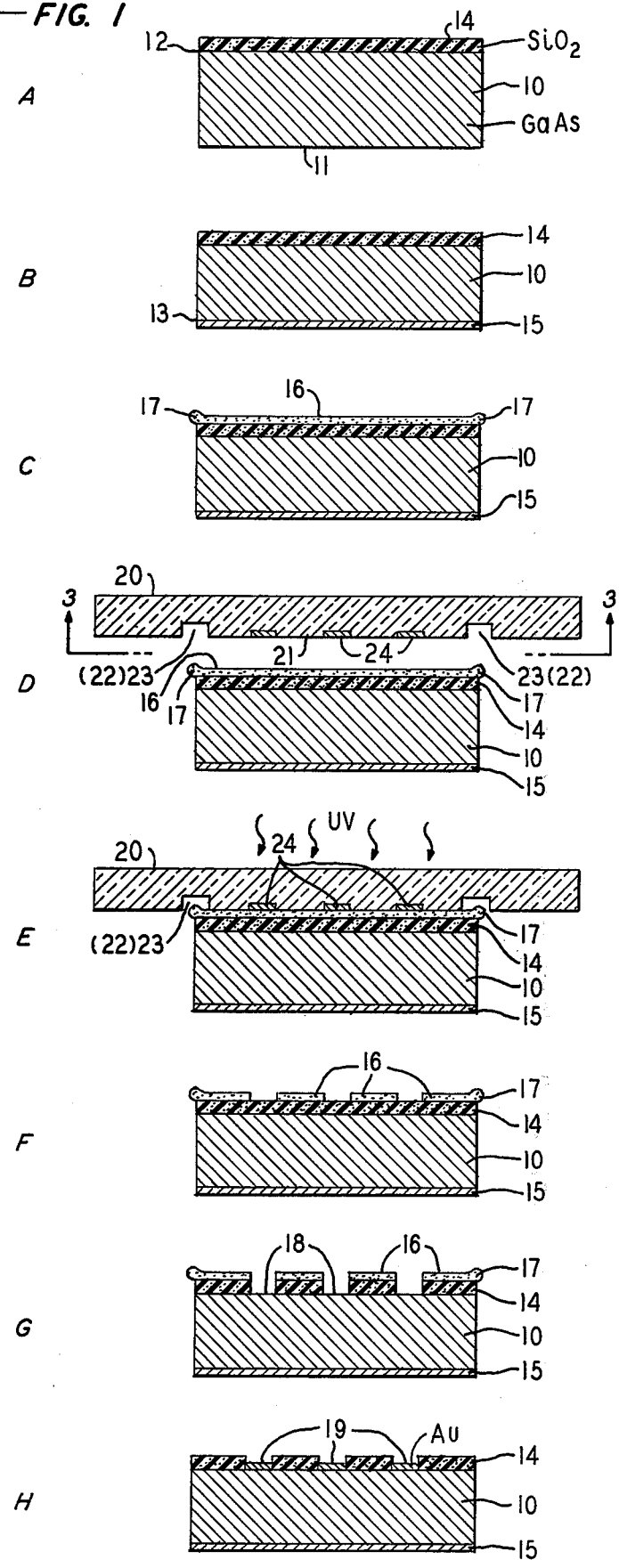
FIG. 1 is a series of cross-sections showing the contact photolithographic process for making semiconductor devices in accordance with the present invention.
Figure 2:
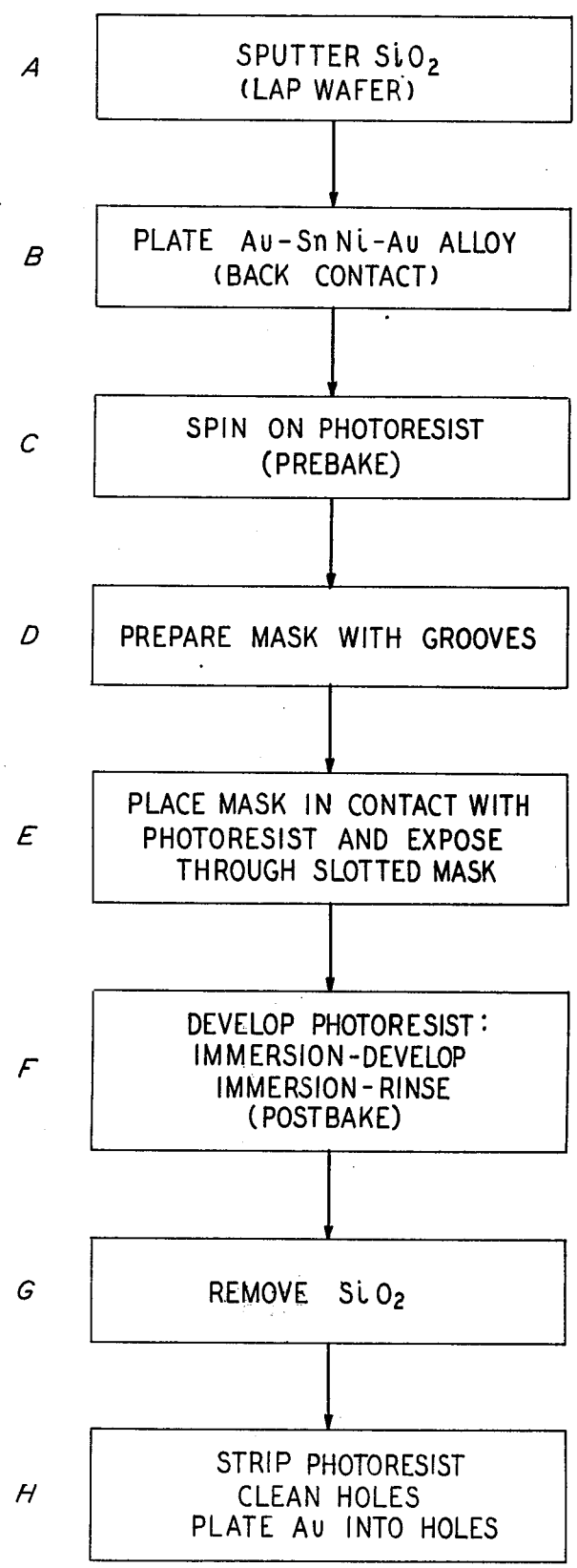
FIG. 2 is a flow chart describing the contact printing photolithographic process shown in FIG. 1.

The illustrative example of a contact printing process for producing an array of semiconductor diodes is presented in FIG. 1. Individual steps are shown in FIGS. 1A through 1H. The flow chart of FIG. 2 presents the process in verbal form in FIGS. 2A through 2H, corresponding to steps of FIGS. 1A through 1H.

A wafer of substrate 10 must first be selected. If the wafer material is expensive, such as GaAs, as shown, its upper and lower surfaces 12 and 11, respectively, will usually be square or rectangular. If the desired end product utilizes a cheaper substrate, such as Si, a wafer having circular upper and lower surfaces might be used since the wasted material is of little consequence. Of course, in still other circuit applications, the underlying substrate is of importance only for its physical support properties and the electrical properties are provided by a coating material.

To produce the diode array, the upper surface 12 is covered with an insulating material 14, such as $SiO_2$, by sputtering to form a layer about 4000 A thick, but the insulator may be applied by many alternative methods, such as, for example, vapor phase deposition, anodizing, thermal oxidation or plasma oxidation. This step is shown in FIG. 1A and may also include lapping or polishing the surface 11 of the wafer to reduce its thickness to a depth appropriate for semiconductor devices (about 125 $\mu$m). In FIG. 1B a layer of conductive coating material 15, such as Au-SnNi-Au alloy is plated on the lower surface 13 to produce the ohmic back contact of the diode.

In FIG. 1C the photoresist material 16 is applied on the top of insulating layer 14. This is conventionally spun on by rotating the substrate wafer 10 while applying the liquid photoresist, which may be any appropriate commercially available material, such as Eastman Kodak 747, or others listed at page 7–25 25 of *Handbook of Thin Film Technology*, by L. I. Maissel and R. Glang, McGraw-Hill, 1970. Spinning the wafer at about 6000 RPM produces a flat portion of photoresist surrounded by a peripheral ridge or build-up 17 which may be on the order of 25 μm. It is assumed that the surface 12 of wafer 10 is square and therefore the resultant build-up 17 is not uniformly distributed around the periphery, but rather is denser at the corners. If the wafer were circular the build-up would be uniform around the circumference. As an alternative to spinning-on the photoresist, the liquid may be sprayed onto a stationary wafer, but this also produces a peripheral build-up because the surface tension of the liquid prevents free flow over the edge of the substrate.

After the photoresist is applied it is normally prebaked in order to drive out residual solvents and improve adhesion to the underlying layer. In the case of Kodak 747, baking at 70° C for 15 minutes is sufficient.

Figure 3:
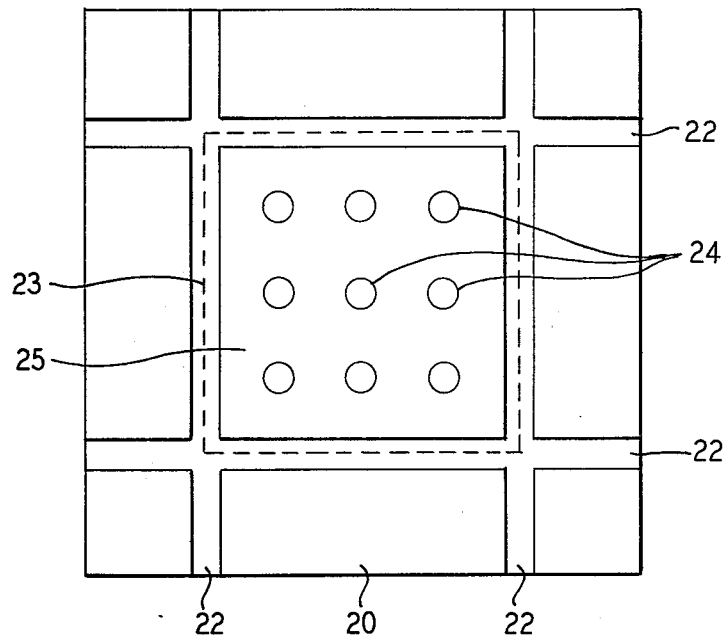
FIG. 3 is a view of the bearing surface of the mask in accordance with the present invention.

FIG. 1D shows the mask 20. It is a glass slab having an operative portion in which is formed the desired pattern of opaque material by any well-known technique, such as etching. The bearing surface 21 of the mask is shown in FIG. 3 and it can be seen that four straight-line grooves 22 are cut into the glass and they are oriented so that the operative portion 25 is surrounded by a channel 23 formed by the intersection of grooves 22. This channel is dimensioned to correspond to the peripheral build-up 17 in the photoresist. The mask pattern is shown simply as an array of opaque areas 24. These areas are opaque at the optical wavelengths (usually ultraviolet) which photochemically affect the photoresist 16, and they may be formed of metal oxides, such as iron-oxide, which are highly absorbing at the optical frequencies or of metals, such as chromium, which are good reflectors at the optical frequencies. It is assumed that the pattern will be formed by deposition of a hard material, such as either an absorbing metal-oxide or a reflecting metal because commercially available masks of this type will produce a hard surface which will not be adversely affected by debris produced during the grinding or milling of the grooves 22. Of course, other types of masks, such as those made by emulsion coating, could be used if the pattern were appropriately protected when the grooves were made. Alternatively, the grooves could be made by laser cutting or an etching technique which would yield no objectionable debris.

The grooves 22 are both wider and deeper than the corresponding dimensions in the build-up 17 so that when the mask is placed in contact with the photoresist 16 as shown in FIG. 1E, the build-up 17 fits within the channel 23 and no resistance is offered while the operative portion 25 of the mask 20 makes good contact with the photoresist. Appropriate illumination, such as at ultraviolet (UV) frequencies, is then radiated through the mask. The opaque areas 24 will, of course, prevent transmission of light to the photoresist through the selected regions, and the exposed pattern on the photoresist is then an image of the mask pattern.

Photoresist 16 is assumed to be a negative photoresist so that the light renders the exposed portions less soluble. FIG. 1F shows the result of developing the photoresist pattern to form the duplicate of the mask pattern. The developing is done in a conventional manner which includes, for Kodak 747, immersion developing followed by an immersion rinse. The photoresist 747 is then postbaked at 120° C for 15 minutes.

After using an etching acid, such as buffered HF, to remove the $SiO_2$ exposed by the photoresist development, holes 18 are formed into $SiO_2$ thus duplicating the developed photoresist pattern as seen in FIG. 1G.

The fabrication of the diodes is then completed by stripping the remaining photoresist with an appropriate solvent, cleaning the holes 18 and plating the conductor 19, such as Au, into the holes.

The process of FIG. 1 produces an array of diodes, but the contact printing process may be used to produce many planar structures by appropriate substitution of materials and masking pattern, provided the bearing surface of the mask includes a channel 23 which, by accepting the photoresist build-up 17, will permit the operative portion of the mask to make good contact with the photoresist surface as shown in FIG. 1E. Other irregularities in the photoresist surface or the bearing surface of the mask should also be overcome in order to insure intimate physical contact.

Figure 4:
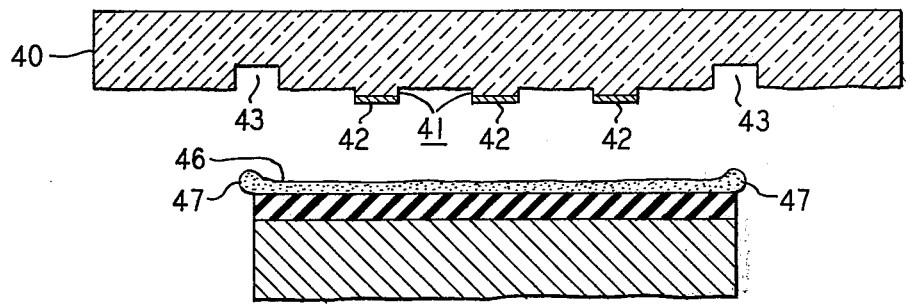
FIGS. 4 and 5 are cross-sections illustrating additional modifications which may be made to a mask in accordance with the present invention.

If variations on the surfaces of either the photoresist, the mask, or both are large relative to the size of the opaque areas of the mask, this lack of linear flatness of these mating surfaces will prevent good contact and poor reproduction will result. If, as shown in FIG. 4, the mask 40 is modified so that the opaque areas 42 are raised from the mask surface on mounds or mesas 41, only the mesas will bear against the photoresist layer 46 and the nonlinearity of the surfaces have no significant effect upon the accuracy of the image formed on the photoresist. The mesa may be formed by etching the surface of the mask surrounding the opaque areas 42 to a depth of approximately 1 μm after applying the opaque material. This etching is, of course, in addition to the channel 43 formed to accept the photoresist build-up 47 formed on the photoresist surface.

It is possible that these mesas will reduce multiple reflections which occur between the wafer surface and the bearing surface of the opaque material 42 especially where the opaque material is metal and therefore reflective. The rise of the mesa refracts light rays so that they tend to experience fewer multiple reflections than they would if the opaque material were on the bearing surface of the mask.

Figure 5:
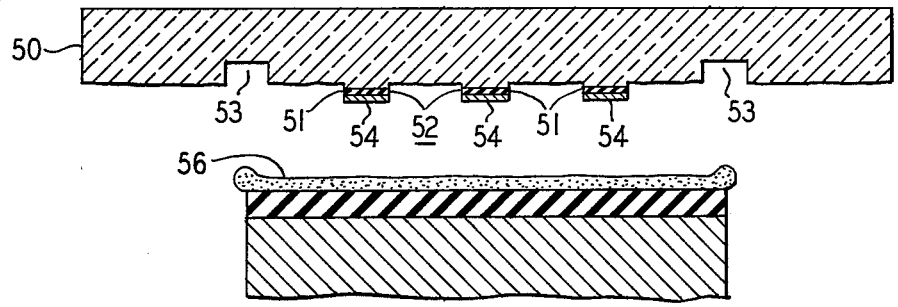

Small variations in the surface of the photoresist produce a surface roughness. If the bearing surface of the mask is made flexible, such as could be done by applying a durable and flexible coating, the effect of this roughness will be reduced. This coating may be, for example, a fully exposed and heat-treated photoresist. The opaque areas would then be applied over the flexible coating, or might be selectively included in the coating. FIG. 5 shows a mask 50 having the flexible coating 51 between the body of the mask and the opaque material 54, as well as the mesa structures 52 and the channel 53. In combination, these features allow intimate contact between the opaque portions 54 of the mask and the photoresist layer 56, and the resultant image on the photoresist could have resolution as high as ± 0.5 μm.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. A process for photolithographic printing of a planar structure on a substrate wafer comprising the steps of:

applying a photoresist material onto the surface of the substrate wafer to form a relatively flat portion and a build-up at the periphery of the wafer, forming a mask having a desired pattern thereon, cutting in the mask a channel corresponding to the peripheral build-up of the photoresist, placing the mask in contact with the relatively flat portion of the photoresist, the build-up being positioned within the channel, exposing the photoresist to light through the mask to form a pattern in the photoresist, and removing portions of the wafer surface in accordance with the pattern in the photoresist.

2. A process in accordance with claim 1 wherein the desired pattern is formed on the mask by deposition of a material opaque at the frequency of the exposing light, and the step of cutting the channel in the mask includes mechanically grinding the mask to produce the channel.

3. A process in accordance with claim 2 wherein the desired pattern formed on the mask is formed on the mask by deposition of a metal oxide.

4. A process in accordance with claim 2 wherein the desired pattern formed on the mask is formed on the mask by deposition of a metal.

5. A process in accordance with claim 1 wherein the wafer surface is rectangular and the step of cutting a channel in the mask includes cutting a plurality of intersecting linear grooves to form the channel which defines a rectangle corresponding to the photoresist buildup at the periphery of the rectangular surface of the wafer.

* * * * *